(12) United States Patent
Osada et al.

(10) Patent No.: US 7,336,526 B2
(45) Date of Patent: Feb. 26, 2008

(54) SEMICONDUCTOR DEVICE

(75) Inventors: Kenichi Osada, Tokyo (JP); Takayuki Kawahara, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 44 days.

(21) Appl. No.: 11/324,357

(22) Filed: Jan. 4, 2006

(65) Prior Publication Data

US 2006/0146634 A1   Jul. 6, 2006

(30) Foreign Application Priority Data

Jan. 5, 2005 (JP) ............................. 2005-000863

(51) Int. Cl.
*G11C 11/00* (2006.01)
(52) U.S. Cl. ..................... 365/163; 365/148
(58) Field of Classification Search ............. 365/163, 365/148, 113
See application file for complete search history.

(56) References Cited

U.S. PATENT DOCUMENTS

| | | | | |
|---|---|---|---|---|
| 5,574,679 | A | 11/1996 | Ohtsuki et al. | ............. 365/145 |
| 5,798,964 | A | 8/1998 | Shimizu et al. | ............. 365/145 |
| 6,768,665 | B2 * | 7/2004 | Parkinson et al. | ............. 365/113 |
| 7,038,961 | B2 * | 5/2006 | Sakata et al. | ............. 365/205 |
| 7,085,154 | B2 * | 8/2006 | Cho et al. | ............. 365/163 |
| 7,092,277 | B2 * | 8/2006 | Bedeschi et al. | ............. 365/148 |

FOREIGN PATENT DOCUMENTS

| | | |
|---|---|---|
| JP | 8-124377 | 5/1996 |
| JP | 8-124379 | 5/1996 |
| JP | 2003-100084 A | 4/2003 |

OTHER PUBLICATIONS

Manzur Gill, Tyler Lowrey, and John Park, "Ovonic Unified Memory—A High-Performance Nonvolatile Memory Technology for Stand-Alone Memory and Embedded Applications", 2002 IEEE International Solid-State Circuits Conference, pp. 202-203.

A. Pirovano, A. L. Lacaita, D. Merlani, A. Benvenuti, F. Pellizzer, and R. Bez, "Electronic Switching Effect and Phase-Change Memory Cells", 2002 IEEE International Electron Device Meeting, Technical Digest, pp. 923-926.

Y. N. Hwang, J.S. Hong, S. H. Lee, S.J. Ahn, G.T. Jeong, G.H. Koh, H.J. Kim, W.C. Jeong, S.Y. Lee,, J.H. Park, K.C. Ryoo, H. Horii, Y.H. Ha, J.H. Yi, W.Y. Cho, Y.T. Kim, K.H. Lee, S.H. Joo, S.O. Park, U.I. Jeong, H.S. Jeong and Kinam Kim, Completely CMOS-Compatible Phase-Change Nonvolatile RAM Using NMOS Cell Transistors, 2003 Non-Volatile Semiconductor Memory Workshop Digest of Technical Papers, pp. 91-92.

* cited by examiner

*Primary Examiner*—Anh Phung
(74) *Attorney, Agent, or Firm*—Miles & Stockbridge P.C.

(57) ABSTRACT

To improve the reliability of the phase change element, unwanted current should not be flown into the element. Therefore, an object of the present invention is to provide a memory cell that stores information depending on a change in its state caused by applied heat, as well as an input/output circuit, and to turn off the word line until the power supply circuit is activated. According to the present invention, unwanted current flow to the element can be prevented and thereby data destruction can be prevented.

8 Claims, 17 Drawing Sheets

FIG. 10

| VOLTAGE | LARGE ← | | | | | → SMALL |
|---|---|---|---|---|---|---|
| PATTERN | | Vreset | | Vset | | Vread | |
| 1 | VDD | VDD REGULATE | | VDD REGULATE | | VDD REGULATE | |
| 2 | | VDD | | VDD REGULATE | | VDD REGULATE | |
| 3 | | VDD BOOST | VDD | VDD REGULATE | | VDD REGULATE | |
| 4 | | VDD BOOST | | VDD | | VDD REGULATE | |
| 5 | | VDD BOOST | | VDD BOOST | VDD | VDD REGULATE | |
| 6 | | VDD BOOST | | VDD BOOST | | VDD | |
| 7 | | VDD BOOST | | VDD BOOST | | VDD BOOST | VDD |
| 8 | VDDQ/VDD | VDD REGULATE | | VDD REGULATE | | VDD REGULATE | |
| 9 | VDDQ | VDD | | VDD REGULATE | | VDD REGULATE | |
| 10 | VDDQ | VDDQ REGULATE | VDD | VDD REGULATE | | VDD REGULATE | |
| 11 | VDDQ | VDDQ REGULATE | | VDD | | VDD REGULATE | |
| 12 | VDDQ | VDDQ REGULATE | | VDDQ REGULATE | VDD | VDD REGULATE | |
| 13 | VDDQ | VDDQ REGULATE | | VDDQ REGULATE | | VDD | |
| 14 | VDDQ | VDDQ REGULATE | | VDDQ REGULATE | | VDDQ REGULATE | VDD |
| 15 | | VDDQ | VDD | VDD REGULATE | | VDD REGULATE | |
| 16 | | VDDQ | | VDD | | VDD REGULATE | |
| 17 | | VDDQ | | VDDQ REGULATE | VDD | VDD REGULATE | |
| 18 | | VDDQ | | VDDQ REGULATE | | VDD | |
| 19 | | VDDQ | | VDDQ REGULATE | | VDDQ REGULATE | VDD |
| 20 | | VDDQ BOOST | VDDQ | VDD | | VDD REGULATE | |
| 21 | | VDDQ BOOST | VDDQ | VDDQ REGULATE | VDD | VDD REGULATE | |
| 22 | | VDDQ BOOST | VDDQ | VDDQ REGULATE | | VDD | |
| 23 | | VDDQ BOOST | VDDQ | VDDQ REGULATE | | VDDQ REGULATE | VDD |
| 24 | | VDDQ BOOST | | VDDQ | VDD | VDD REGULATE | |
| 25 | | VDQD BOOST | | VDDQ | | VDD | |
| 26 | | VDDQ BOOST | | VDDQ | | VDDQ REGULATE | VDD |
| 27 | | VDDQ BOOST | | VDDQ BOOST | VDDQ | VDD | |
| 28 | | VDDQ BOOST | | VDDQ BOOST | VDDQ | VDDQ REGULATE | VDD |
| 29 | | VDDQ BOOST | | VDDQ BOOST | | VDDQ | VDD |

SEMICONDUCTOR DEVICE

CLAIM OF PRIORITY

The present application claims priority from Japanese application JP 2005-000863 filed on Jan. 5, 2005, the content of which is hereby incorporated by reference into this application.

FIELD OF THE INVENTION

The present invention relates to a semiconductor device and a semiconductor memory device, and more specifically to a nonvolatile memory and an on-chip memory to be mounted on a system LSI such as a microcomputer.

BACKGROUND OF THE INVENTION

In an effort to realize a high-speed and highly integrated nonvolatile memory, development of phase change memories is now under way. The phase change memory is described in Non-patent documents 1, 2, and 3 and JP-A No. 100084/2003. As described in 2002 IEEE International Solid-State Circuit Conference, Digest of Technical Papers, pp. 202-203, the phase change memory employs a phase change material called chalcogenide as a resistive memory element, and stores information by taking advantage of a property of this material that the resistance of the storage element changes depending on the state of the phase change material. A write to the phase change resistor is performed by supplying a current to heat it, and thereby changing the state of the material. Raising the resistance (amorphousize), also called a RESET operation, is done by maintaining it at a relatively high temperature, whereas lowering the resistance (crystallize), also called a SET operation, is done by keeping it at a relatively low temperature for a sufficient period of time. A read from the phase change material is performed by supplying a current that is not so large as to change the state of the phase change resistor.

2002 IEEE International Electron Devices Meeting, Technical Digest, pp. 923-926 and JP-A No. 100084/2003 describe the properties of the phase change resistor, and 2003 Non-Volatile Semiconductor Memory Workshop, Digest of Technical Papers, pp. 91-92 discusses a memory cell composed of phase change resistors and NMOS transistors.

These documents discuss the potentialities of the phase change memory not only as high-speed ROM (Read-Only Memory) but also as non-volatile RAM (Random Access Memory), and also refer to the realization of the unified memory having both ROM and RAM functions. For the phase change memory, the smaller the electrode surface area of the phase change resistor, the smaller power required to change the phase change resistance, thus facilitating the scaling. In addition, since the phase change resistance changes greatly, high-speed read operations can be achieved. For these reasons, it is expected that high-speed nonvolatile memory using the phase change memory will be realized.

Furthermore, in order to realize the high-speed nonvolatile memory as described above, ferroelectric memory using a ferroelectric material as storage element is proposed. The ferroelectric memory employs a ferroelectric material as the insulator of a capacitor of the storage element, and stores information depending on its polarization. A write to the ferroelectric memory is performed by applying a voltage to the storage element to change its polarization. JP-A No. 124377/1996 points out a problem that if a potential difference occurs across the capacitor of the storage element during power off, the polarization of the ferroelectric is reversed, resulting in a destruction of the stored data. As a solution to this problem, this Patent document discloses an internal circuit that sets all the word lines at unselected level. Also, JP-A No. 124379/1996 shows a problem that a potential difference occurs across the capacitor of the storage element during power on and thereby the polarization of the ferroelectric is reversed, destroying the stored data. As a solution to this problem, a technology that causes the bit and plate lines to be at the same potential is disclosed in this document.

SUMMARY OF THE INVENTION

The inventors of the present invention and others reviewed the reliability of the phase change memory before starting the invention. In the ferroelectric memory described in Patent documents 2 and 3, the storage element is a capacitor and information is stored by its polarization, and hence the data is rewritten when a voltage is applied. An unexpected potential difference in the storage element will destroy the data in it. On the other hand, the storage element of the phase change memory is a resistor, and the data is rewritten when the resistor is heated by applied current. Since the information storage and rewriting mechanism of the phase change memory is different from that of the ferroelectric memory, an unexpected potential difference will not lead directly to data destruction, but data destruction due to reasons unique to the phase change memory can occur. The inventors of the present invention and others reviewed the reliability of the phase change memory from the viewpoint unique to the phase change memory. The phase change memory stores values according to the state of a crystal, and it was found that there is a problem with the phase change memory that a state change from amorphous to crystalline may cause data destruction. It was also found that heat generation is caused by a transient current flowing through a storage element due to a noise during power on/off or a current flowing during a read operation, and that repeated heating of resistor makes the crystallization progress gradually and may result in a data destruction. An object of the present invention is therefore to minimize the current flow through the storage element during power on/off and thereby suppress heat generation, and eventually realize a highly reliable memory by suppressing the heat generation during a read operation.

Brief descriptions of the representative embodiments of the present invention are given below.

A first embodiment comprises memory cells that store information by applying heat to change the state thereof, and an input/output circuit, wherein the word line is deactivated until the power supply circuit is turned on during power on.

A second embodiment comprises memory cells that store information by applying heat to change the state thereof, and an input/output circuit, wherein the bit line and source line are connected to each other until the power supply circuit is turned on during power on.

A third embodiment comprises memory cells that store information by applying heat to change the state thereof, and an input/output circuit, wherein if the same data is read successively the pre-read data is output, instead of turning on the word line.

A fourth embodiment comprises memory cells that store information by applying heat to change the state thereof, and an input/output circuits, wherein when an error bit is detected by the error checking and correction (ECC) that data is written again.

As described above, the present invention allows the realization of a highly reliable memory.

BRIEF DESCRIPTION OF THE DRAWINGS

FIG. 10 is a list showing the patterns of the power supply circuit;

DETAILED DESCRIPTION OF THE PREFERRED EMBODIMENTS

Figure 1:
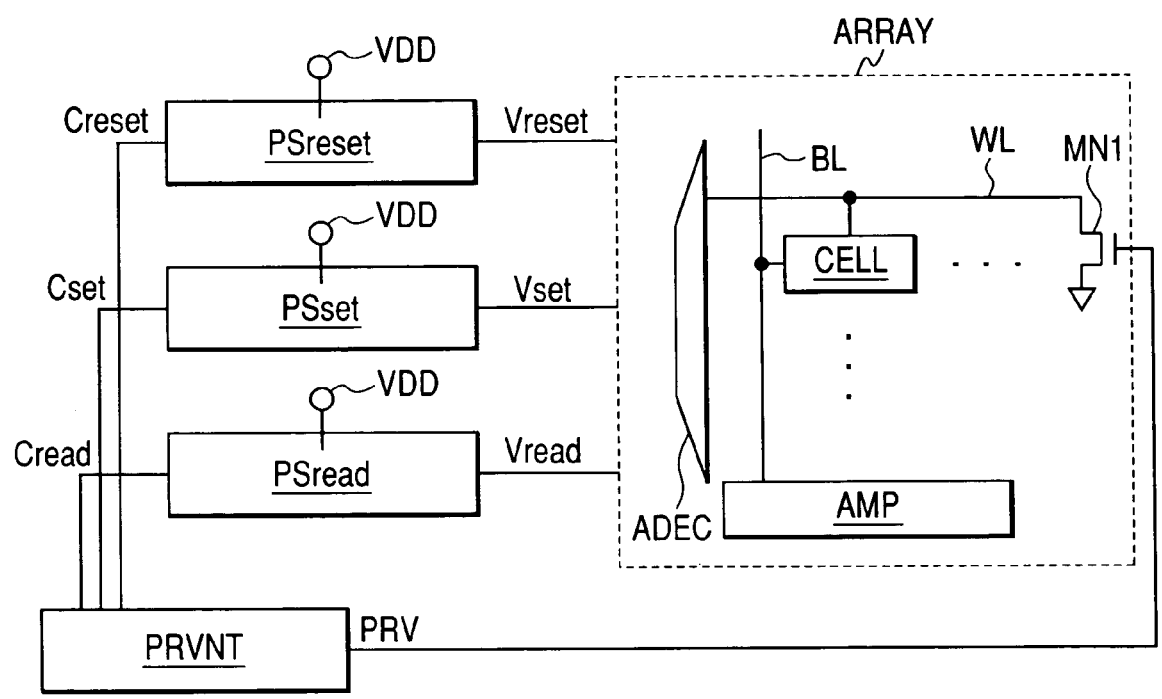
FIG. 1 is a circuit diagram showing a circuit according to the present invention.

Thereafter, some preferred embodiments of the semiconductor memory according to the present invention will be described with reference to the drawings. There is no particular limitation to the circuit elements constituting each function block of the embodiments, but they are formed on a single semiconductor substrate, such as single crystal silicon, by means of an integrated circuit technology including the well-known CMOS (complementary MOS transistor). In the drawings, although the connection to the substrate potential of a MOS transistor is not shown, the connection method is not limited as long as the MOS transistor can operate normally. Also, unless otherwise noted, the low level of a signal is represented as 'L' and the high level as 'H'.

As discovered by the inventors of the present invention and others, the most significant problem with the phase change memory is data destruction due to the state transition from amorphous to crystalline, which occurs during power on/off or during a read operation. Particularly, in the memory formed on the same semiconductor in which a CPU and the like are formed, the CPU at power on has not been reset and the state of a control signal is not definite, and also the data destruction characteristics vary with elements, thus inducing problems and making the matter serious. Circuit scheme to solve these problems will be described below.

Figure 2A:
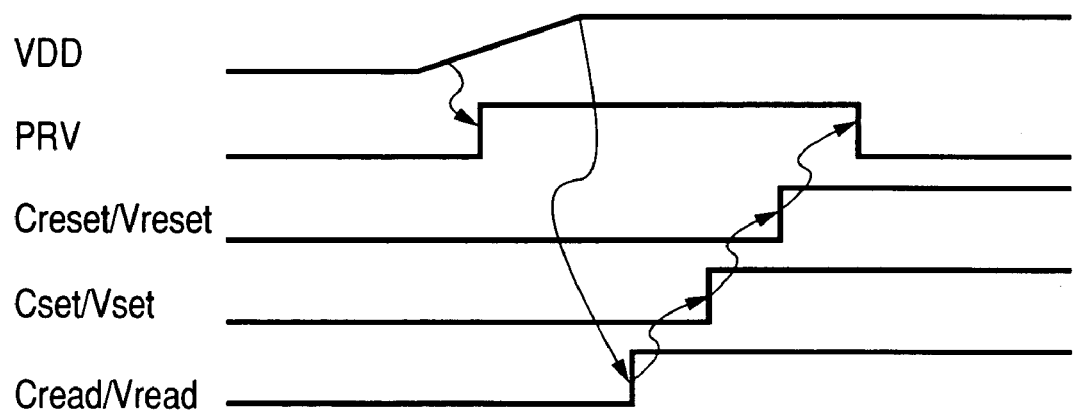
FIGS. 2A and 2B are operating waveform diagrams of the circuit shown in FIG. 1.

Power On/Off Sequences:

FIG. 1 shows the chip configuration of the present invention and FIG. 2 the operating waveforms during power on (a) and those during power off (b). An memory array ARRAY comprises a plurality of word lines WL and a plurality of bit lines BL, and to the intersection of a word line WL and a bit line BL, a memory cell CELL is connected. Each memory cell CELL is connected to a word line WL and a bit line BL. A memory cell is composed of an N-channel MOS transistor and a storage element. The storage element is, for example, an element called phase change element. An amplifier circuit AMP is connected to the bit line BL, and a decoder circuit DEC is connected to the word line WL. Also, an N-channel MOS transistor MN1 to force the word line WL to be at ground potential is connected to the word line WL, and the gate electrode is connected to a control signal PRV. A power supply circuit consists of three types of circuits: PSreset to supply a reset voltage, PSset to supply a set voltage, and PSread to supply a read voltage. The PSreset supplies a reset voltage Vreset, the PSset a set voltage Vset, and the PSread a read voltage Vread to the memory array ARRAY. An activation signal Cread is input to the PSreset, a Cset to the PSset, and a Cread to the PSread. A voltage level detect circuit PRVNT is a circuit which detects that power supply voltage has been provided, and outputs a control signal (Creset, Cset, Cread, PRV) to each circuit. At power on, when an external power supply voltage VDD changes to 'H' from 'L', the PRVNT detects this and outputs 'H' to the signal PRV that forces the word line WL to be at ground potential. Thereafter, the PRVNT sets the signals Cread, Cset, and Creset at 'H' level in this order, and activates the power supply circuits, starting from that with a lowest output voltage. It is generally safer to power on the lowest voltage power supply circuit first, but it is possible to power on the three power supply circuits simultaneously or in a different order. When all the power supply circuits are stabilized, the signal PRV is changed to 'L' from 'L' and the word line WL is disconnected from ground potential. This operation prevents a current flow to a storage element during power on, and thereby prevents data destruction resulting from heat generation.

Figure 2B:
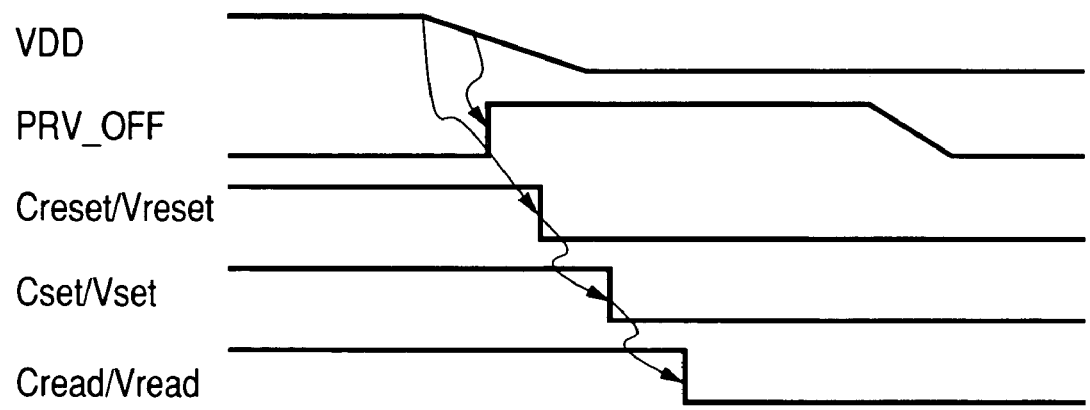

Similarly, it is possible to prevent data destruction by forcing the word line to be at ground potential during power off. FIG. 2(b) shows the operating waveforms during power off. When an external power supply voltage VDD changes from 'H' to 'L', a voltage level detect circuit PRVNT_OFF detects this and outputs 'H' to a signal PRV_OFF that forces the word line WL to be at ground potential. Then, the PRVNT_OFF changes the signals Creset, Cset, and Cread to 'L' level in this order, and deactivates the power supply circuits, starting from the one with higher output voltage. It is generally safer to power off the highest potential power supply circuit first, but it is possible to power on the three power supply circuits simultaneously or in a different order. This operation prevents a current flow to the storage element during power on, and thereby prevents data destruction due to heat generation.

Further, by properly setting the sensitivity of a circuit that detects power on/off, even if a large noise enters the power supply other than during actual power on or power off, and consequently the power supply voltage becomes out of the desired range, it is possible to prevent data destruction due to such a noise.

The purpose of the present invention is to prevent the destruction of stored data by shutting off a current flow to the storage element while the power supply circuit is unable to supply power stably. Forcing the word line to be at ground potential to make it unselected is one example of this. Modifications within the spirit of the present invention is possible, for example, allowing a potential other than ground potential, or permitting the blocking of the current path with usually conceivable leaks.

Memory Array Configuration:

Next, an example of the detailed circuit of the memory array in FIG. 1 will be described with reference to a memory array ARRAY1 shown in FIG. 3. The memory array ARRAY1 is mounted as an on-chip memory on a microcontroller, or mounted on a single non-volatile memory. A memory array MEM_ARY is composed of a plurality of word lines WL and a plurality of bit lines BL, the memory cell CELL is connected to the intersection of the word line WL and the bit line BL. Each memory cell CELL is connected to the word line WL at a node N1, to the bit line BL at a node N2, and to ground potential at a node N3, as exemplified in a memory cell CELL00. Each memory cell CELL is shown in detail in FIGS. 4A and 4B. Each of the memory cells consists of an N-channel MOS transistor MN00 and a storage element PCM00. The storage element PCM00 can be, for example, an element called phase change element, or one that has low resistance of about 10 kΩ in crystalline state and high resistance of 100 kΩ or more in amorphous state. The state of the storage element PCM00 will change with the temperature of a heat applied thereto. Specifically, heating the storage element to a high temperature to melt it and then rapidly cooling it will cause the element to become amorphous, whereas heating the storage element at a low temperature for a relatively long period of time will cause the element to become crystalline. Causing the amorphous state is called a reset operation and causing the crystalline state is called a set operation. The temperature at which the element is heated can be varied by changing the value of current to be flow through the storage element PCM00, and the period of time for which current flows. To the gate electrode of the N-channel MOS transistor MN00, a word line WL is connected via the node N1, which turns on the N-channel MOS transistor when selected, and turns it off when unselected. In addition, the memory cell of this embodiment reads information according to the resistance of the storage element PCM00, i.e., the magnitude of the current flowing from the bit line to the source line. Therefore, one terminal of the phase change element PCM00 may be connected to ground potential via the node N3 as shown in FIG. 4A, or one terminal of the PCM00 may be connected to the bit line via the node N2 as shown in FIG. 4B. Unless otherwise noted, the memory cell shown in FIG. 4B is used herein.

Figure 4A:
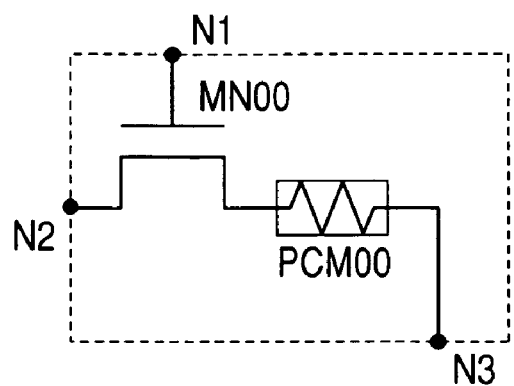
FIGS. 4A, 4B, 4C, and 4D are circuit diagrams showing memory cells used in the memory array in FIG. 3.
Figure 4B:
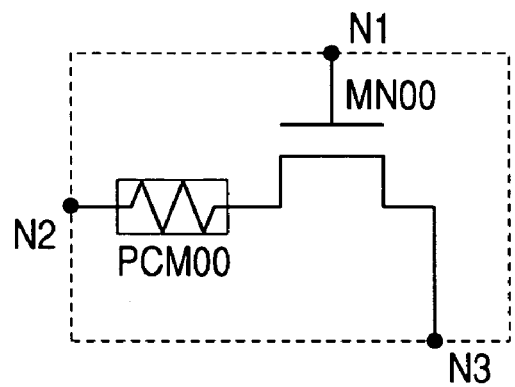
Figure 4C:
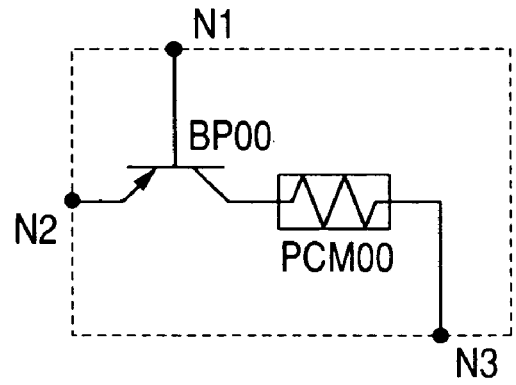
Figure 4D:
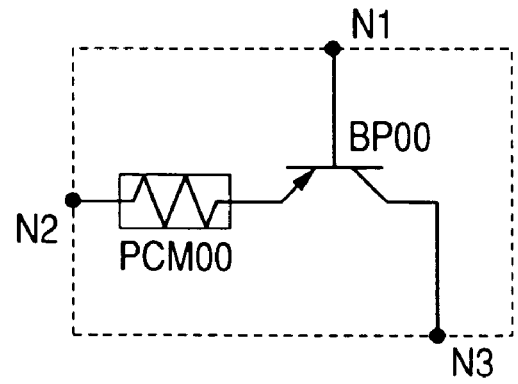

Another embodiment of the memory cell is shown in FIGS. 4C and 4D. Each memory cell is composed of a PNP bipolar transistor BP00 and a storage element PCM00. The storage element PCM00 can be, for example, an element called a phase change element, or one that has a low resistance of about 10 kΩ in crystalline state and a high resistance of 100 kΩ or more in amorphous state. To the base electrode of the PNP bipolar transistor BP00, a word line WL is connected via the node N1, which turns on the PNP bipolar transistor BP00 when selected, and turns it off when unselected. In addition, the memory cell of this embodiment reads information according to the resistance of the storage element PCM00, i.e., the magnitude of the current flowing from the bit line to the source line. Therefore, it is possible to connect one terminal of the phase change element PCM00 to ground potential via the node N3 and the other terminal to the collector electrode of the PNP bipolar transistor BP00, as shown in FIG. 4C, or to connect one terminal of the PCM00 to the bit line via the node N2, and the other terminal to the emitter electrode of the PNP bipolar transistor BP00, as shown in FIG. 4D. Unless otherwise noted, the memory cell shown in FIG. 4D is used herein.

With reference to FIG. 3 again, the description of the detailed circuit of the memory array will continue. To the word line WL, word drivers WD0 and WD1 are connected. The word drivers WD0 and WD1 are arranged in a column to form a word driver array WD_ARY. For example, the word driver WD0 is composed of an N-channel MOS transistor NM10 and a P-channel MOS transistor MP10 that select the word line WL0, and an N-channel MOS transistor MN2 that forces the word line WL0 to be at 0V, and select one word line WL by means of the decoder circuit ADEC. The gate electrode of an N-channel MOS transistor MN2 is connected to the control signal PRV. An address XADD is input to the decoder circuit ADEC.

A read precharge circuits PCR is connected to the bit line BL. The read precharge circuits PCR are arranged in a row to form a precharge circuit array PC_ARY. Specifically, for example, a precharge circuit PCR0 is composed of a P-channel MOS transistor MP20, and a bit line BL0 is connected to the drain electrode, a control signal PC0 to the gate electrode, and a read power supply potential line Vread to the source electrode. The read precharge circuits PCR are alternately connected to the control signal lines (PC0, PC1).

To the bit line BL, a column select circuit YS is also connected. The column select circuits YS are arranged in a row to form a column select circuit array YS_ARY. Specifically, for example, the column select circuit YS0 is composed of P-channel MOS transistors (MP30, MP31), and the bit line BL0 is connected to the drain electrode of the P-channel MOS transistor MP31, the control signal YSR0 to the gate electrode, and a write amplifier circuit WA0 to the source electrode. Also, the bit line BL0 is connected to the drain electrode of the P-channel MOS transistor MP30, the control signal YSW0 to the gate electrode, and the write amplifier circuit WA0 to the source electrode. The column select circuits YS are alternately connected the control signal lines (YSR0 or YSR1, and YSW0 or YSW1). Therefore, the bit lines BL that are read or written in parallel are controlled alternately. That is, the memory cell adjacent to a memory cell performing a read or write operation is always unselected. Because of this, memory cells generating heat are located alternately, which prevents localized heat generation and thus allows more stable operation of the semiconductor integrated circuit.

A sense amplifier circuit SA amplifies data by means of an activation signal SA_EN, and outputs the data to a data bus RDATA. The write amplifier circuit WA supplies an appropriate voltage to the bit line BL via a data bus WDATA and a control signal WA_CONT. The sense amplifier circuit SA and a write amplifier circuit WA are arranged in a row to form an amplifier array AMP_ARY.

The sense amplifier circuit SA is composed of a sense amplifier section comprising N-channel MOS transistors (MN40, MN41, MN42) and P-channel MOS transistors (MP43, MP44), a sense amplifier precharge section comprising P-channel MOS transistors (MP40, MP41, MP42), a reference Y switch section comprising a P-channel MOS transistor MP45, and an output circuit comprising an inverter circuit INV0. The sense amplifier section is a latched sense amplifier circuit that is composed of a flip-flop comprising P-channel MOS transistors (MP43, MP44) and N-channel MOS transistors (MN40, MN41), and an N-channel MOS transistor MN42 that activates the sense amplifier. To the gated electrode of the N-channel MOS transistor MN42, the activation signal SA_EN is connected. The sense amplifier precharge section consists of the P-channel MOS transistors (MP40, MP41) that connect the read power supply line Vread and the internal nodes of the sense amplifier section, and the P-channel MOS transistor MP42 that equalizes the internal nodes of the sense amplifier section. To the gate electrode of the P-channel MOS transistors (MP40, MP41, MP42), the control signal PC_AMP is connected. The gate electrode of the P-channel MOS transistor of the reference Y switch section is connected to the control signal YS_AMP, and the source electrode is connected to a reference voltage VREF. In this embodiment, the read voltage Vread is assumed to be a voltage (for example, 0.5V) lower than the power supply potential. The reference potential VREF is assumed to be between the read power supply potential and ground potential.

The write amplifier circuit WA0 is composed of the P-channel MOS transistor MP46 that supplies a reset voltage Vreset to the bit line BL, the P-channel MOS transistor MP47 that supplies a set voltage Vset to the bit line BL, and a control circuit WCONT that controls the gate electrode of the P-channel MOS transistor (MP46, MP47) based on the value of the write data bus WDATA and the control signal WA_CONT.

The control circuit CNTL receives control signal (SETEND, RESETEND, YADD, CNT) from the outside of the memory array, and generates control signals (PC, YSR, YSW, WA_CONT, SA_EN, PC_AMP, YS_AMP) to be output.

Figure 5:
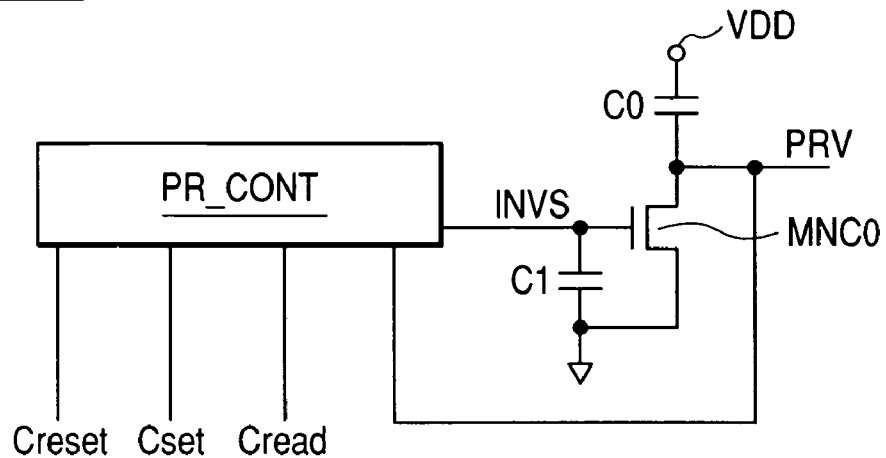
FIG. 5 is a diagram showing the details of the voltage level detect circuit in FIG. 1.

FIG. 5 shows the voltage level detect circuit PRVT. The PRVT is composed of an N-channel MOS transistor MNC0, capacitances (C0, C1), and the control circuit PR_CONT. The capacitance C0 is connected to the external power supply voltage VDD and the drain electrode PRV of the N-channel MOS transistor MNC0, and the capacitance C1 is connected to the gate electrode INVS of the N-channel MOS transistor MNC0. The capacitance C0 is assumed to be larger than a parasitic capacitance to be connected to the PRV, and the capacitance C1 is larger than one to be connected to the INVS. Because of this, when the power supply voltage VDD turned 'H' from 'L' the PRV becomes almost equal to the power supply voltage and the INVS maintains the ground potential.

The PRV is input to the control circuit PR_CONT, which outputs the INVS, Creset, Cset, or Cread.

Figure 6:
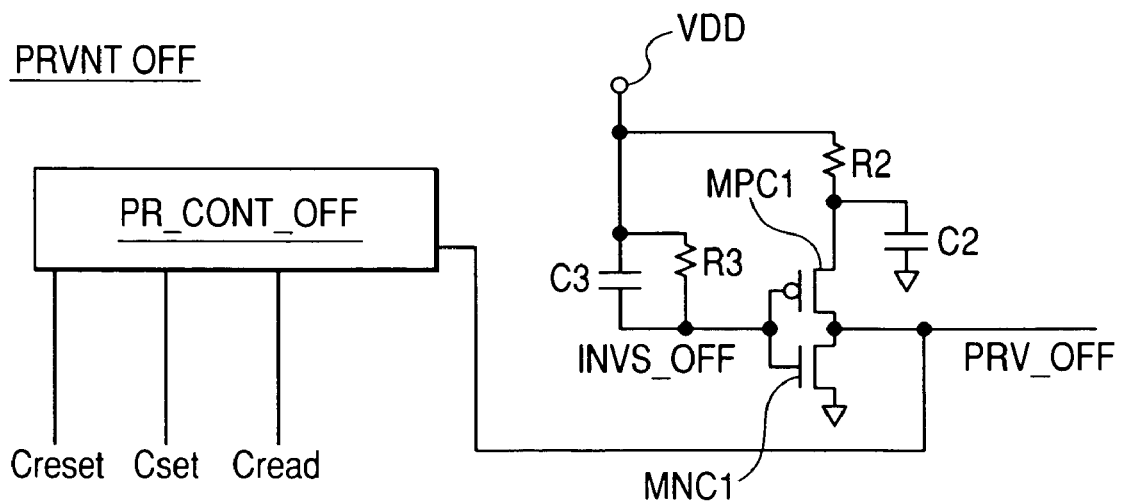
FIG. 6 is a diagram showing the details of the voltage level detect circuit in FIG. 1.

FIG. 6 shows the voltage level detect circuit PRVNT_OFF that detects a power off. The PRVNT_OFF is composed of a P-channel MOS transistor MPC1, an N-channel MOS transistor MNC1, capacitances (C2, C3), resistances (R2, R3), and a control circuit PR_CONT_OFF. The capacitance C3 is connected to the external power supply voltage VDD, and the gate electrode INVS_OFF of the P-channel MOS transistor MPC1 and N-channel MOS transistor MNC1, the capacitance C2 is connected to the resistance R2 and the source electrode of the P-channel MOS transistor MPC1. The drain electrode of the P-channel MOS transistor MPC1 and N-channel MOS transistor MNC1 is connected to the signal PRV_OFF, and the signal PRV_OFF is connected to the control circuit PR_CONT_OFF and is input to the memory array, like the PRV, to control the current flow so that current will not flow through the phase change element PCM during power off. The resistances R3 and R2 are inserted to make the INVS_OFF and the source electrode of the P-channel MOS transistor MCP1 power supply potential level respectively.

The capacitance C3 is assumed to be larger than a parasitic capacitance to be connected to the PRV_OFF, and the capacitance C2 is to be larger than one to be connected to the INVS_OFF. This makes the INVS_OFF ground potential and the PRV_OFF almost the same as the power supply voltage, when the power supply voltage VDD turned 'L' from 'H'.

The PRV_OFF is input to the control circuit PR_CONT_OVV, which outputs the Creset, Cset, or Cread.

Figure 7:
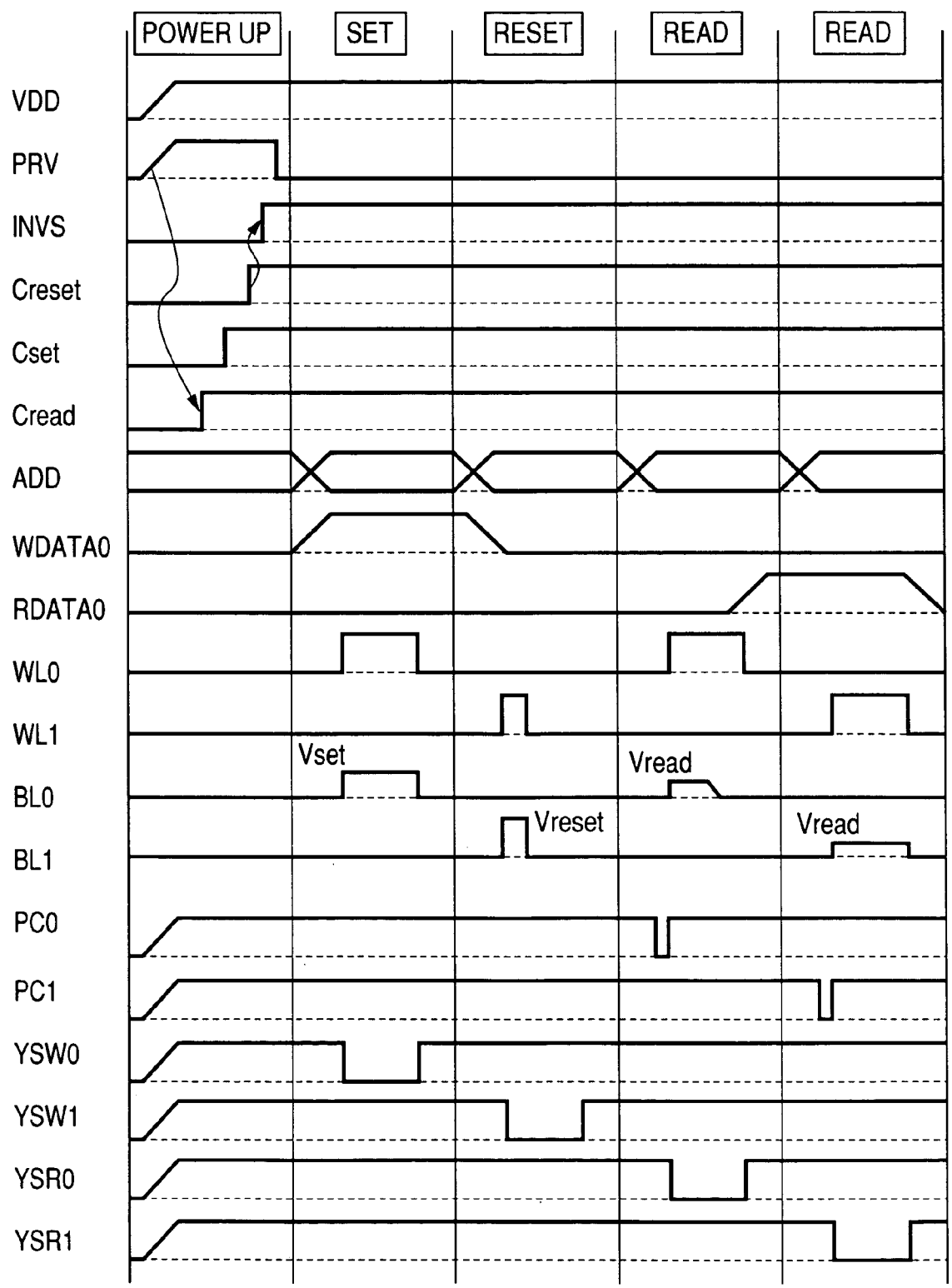
FIG. 7 is an operating waveform diagram of the memory array shown in FIG. 3.

Operation Scheme:

The detailed operation is described with reference to FIG. 7. During power on, when the external power supply voltage VDD changes to 'H' from 'L', the detect circuit PRVNT detects this and the signal PRV becomes 'H'. This causes the N-channel transistors (MN2, MN3) to turn on, all the word lines to be forced to be at ground potential, thus becoming unselected state. Then, the signals Cread, Cset, and Creset are made 'H' level in this order to activate the power supply circuits starting from the one with the lowest output voltage. When all the power supply circuits are stabilized, the control circuit PR_CONT changes the INVS from 'L' to 'H' and thereby changes the signal PRV from 'H' to 'L', to release the forced connection between the word line WL and ground potential.

Thereafter, the following operation is performed.

In this embodiment, the case where data "1" is written to the memory cell CELL00 and data "0" to the memory cell CELL11 is described. The data "1" means that setting the phase change element to cause the resistance to be between 1 and 10 kΩ, and the data "0" means that resetting the phase change memory to cause the resistance to be between 0 and 1 kΩ. The set operation SET is performed first. The address ADD and the write data WDATA are input. The address ADD is divided into an X-address XADD to be input to the decoder circuit ADEC and a Y-address YADD to be input to the control circuit CNTL. The X-address is decoded by the decoder circuit ADEC, and one selected word line WL changes from 'L' to 'H'. In this embodiment, word line WL0 is selected. The Y-address YADD is decoded by the control circuit CNTL into a signal (YSW, YSR) to select a column. In this embodiment, the write control signal YSW0 is selected to cause a transition from 'H' to 'L'.

The write data WDATA0 is input to the write amplifier circuit WA0 and a voltage is supplied to the bit line according to the data to be written; when data "1" is written, the voltage Vset is fed to the bit line. After the voltage is applied for an enough period of time to set the storage element, the word line WL0 is turned off to terminate the write operation.

Next, the reset operation RESET is performed. The address ADD and the write data WDATA0 are changed, and the word line WL1 and the control signal YSWL are selected. The voltage Vreset is supplied to the bit line in order to write data "0". Since the Vreset is required to melt the storage element, it is typically higher than the voltage Vset. After voltage is applied for an enough period of time to reset the storage element, the word line WL1 is turned off to terminate the write operation.

Figure 3:
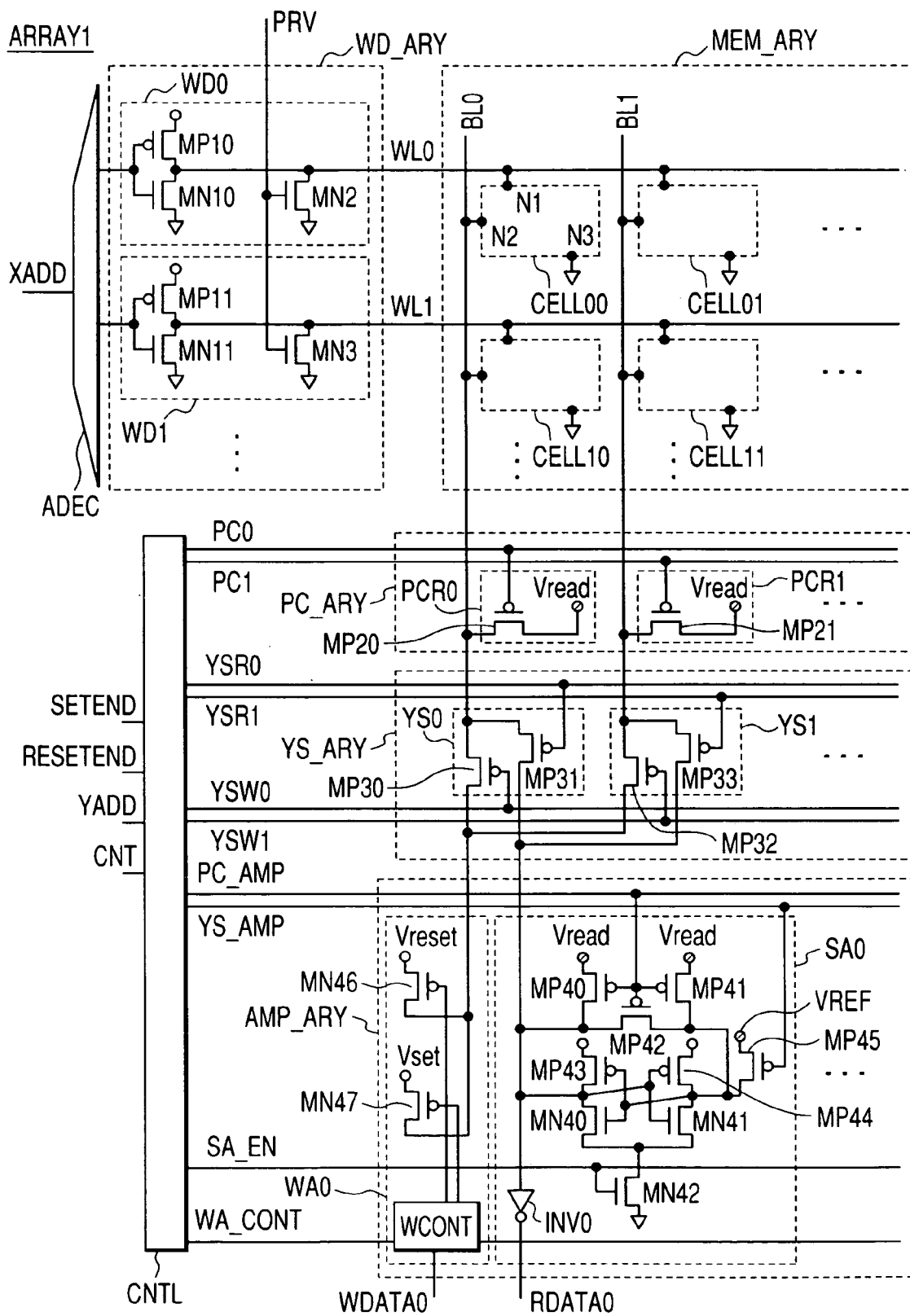
FIG. 3 is a diagram showing the memory array shown in FIG. 1 in detail.

The set end signal SETEND shown in FIG. 3 is a signal that measures the SET duration and indicates the end of SET to the control circuit CNTL, and the reset signal RESETEND shown in the figure is a signal that measures the RESET duration and indicates the end of RESET to the control circuit CNTL. The waveforms of the set end signal SETEND and control circuit CNTL are not shown in FIG. 7; REST duration is typically shorter than SET duration.

Now, the read operation READ is discussed. A read from the memory cell CELL00 is performed first, and then from the CELL11.

The address ADD changes and the word line WL0 and control signal YSR0 are selected. The precharge control signal PC0 changes from 'H' to 'L', and the bit line BL0 is precharged to the read voltage Vread. Also, the control signal PC_AMP changes from 'H' to 'L' and the internal nodes of the sense amplifier circuit SA are precharged. Since the Vread is a voltage that allows a read without destroying the storage element, it usually is lower than the Vset. Then, the control signal PC0 changes from 'L' to 'H' to flow a current from the bit line BL0 to ground potential by means of the memory cell CELL00. Since the storage element of the memory cell CELL00 is in SET state and the resistance is, for example, 1 kΩ to 10 kΩ, the bit line voltage decreases relatively fast to a voltage smaller than the reference voltage VREF. Thereafter, the sense amplifier activation signal SA_EN changes from 'L' to 'H' to amplify the potential difference between the bit line BL0 and reference potential VREF. As a result, "1" is output to the data bus RDATA0.

Next, the address ADD changes and the word line WL1 and control signal YSR1 are selected. The precharge control signal changes from 'H' to 'L' and the bit line BL1 is precharged to the read voltage Vread. Also, the control signal PC_AMP changes from 'H' to 'L' and the internal nodes of the sense amplifier circuit SA are precharged. Then, the control signal PC1 changes from 'L' to 'H' to flow a current from the bit line BL1 to ground potential by means of the memory cell CELL11. Since the storage element of the memory cell CELL11 is in RESET state and the resistance is, for example, 100 kΩ to 1 MΩ, the bit line voltage little changes and remains at a voltage larger than the reference voltage VREF. Thereafter, the sense amplifier activation signal SA_EN changes from 'L' to 'H' to amplify the potential difference between the bit line BL1 and ground potential. As a result, "0" is output to the data bus RDATA0.

In this embodiment, Vreset is 1.5 V, Vset is 1.0 V, Vread is 0.5 V, and reference voltage VREF is 0.2 V, for example.

By the operation described above, a current flow to the storage element during power on is prevented, and hence data destruction can be prevented.

Figure 8:
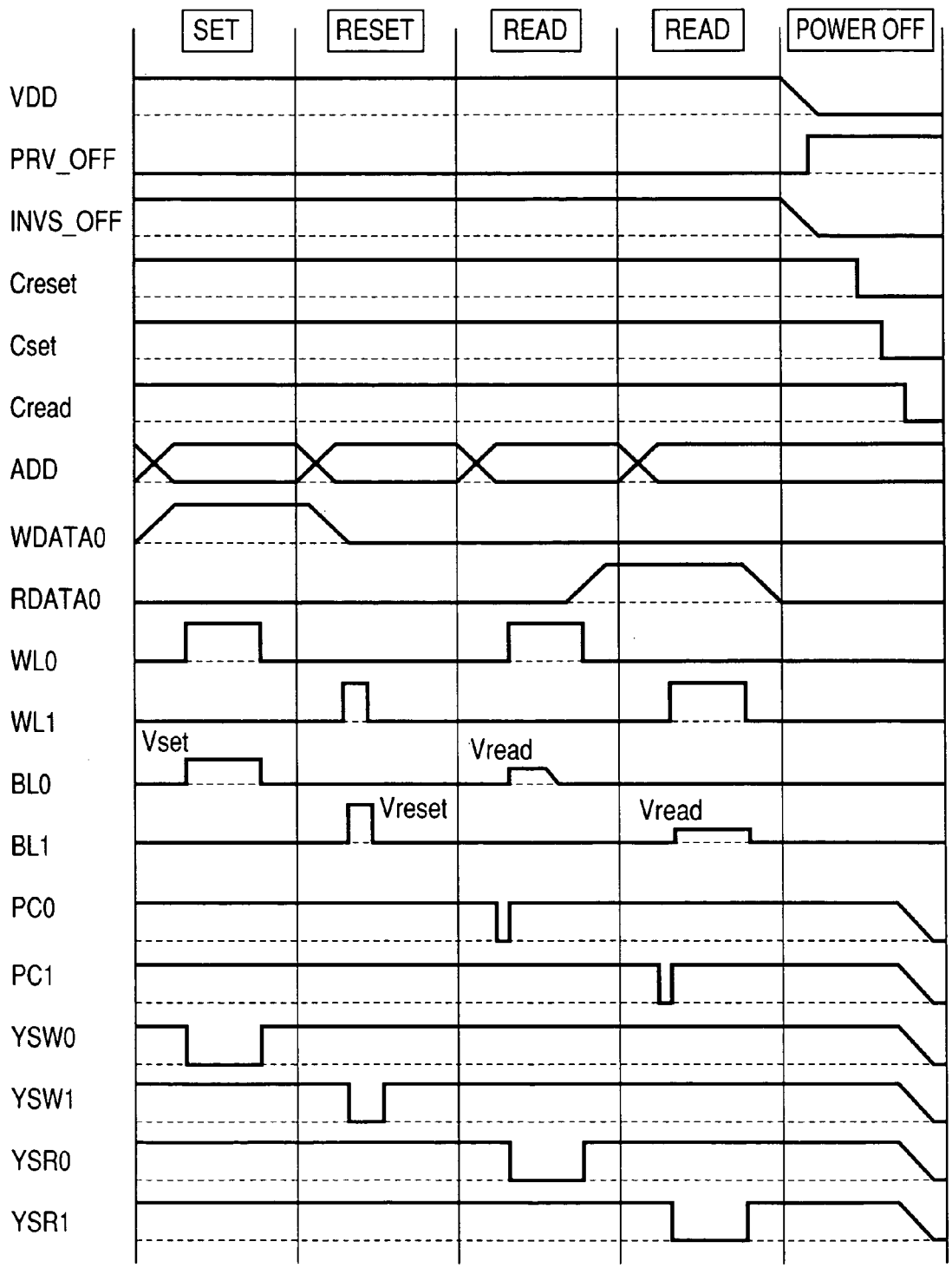
FIG. 8 is another operating waveform diagram of the memory array shown in FIG. 3.

Data destruction can be prevented by forcing all the word lines to be at ground potential and thereby to be unselected during power off. FIG. 8 shows the operating waveforms during power off. The waveforms during the normal operation are as described for FIG. 7. During power off, when the external power supply voltage VDD changes from 'H' to 'L', the detect circuit PRVNT_OFF detects this and the signal PRV_OFF becomes 'H'. This causes the N-channel MOS transistors (MN2, MN3) to turn on, and all the word lines are forced to be at ground potential and thereby to be unselected. Then, the signals Creset, Cset, and Cread turn 'L' level in this order, and the power supply circuits are shut off starting from the one with the lowest output voltage. Thus, data destruction can be prevented by forcing all the word lines WL to be at ground potential, to be unselected until all the power supply circuits are shut off during power off, and thereby preventing current flow to the storage element.

Figure 9:
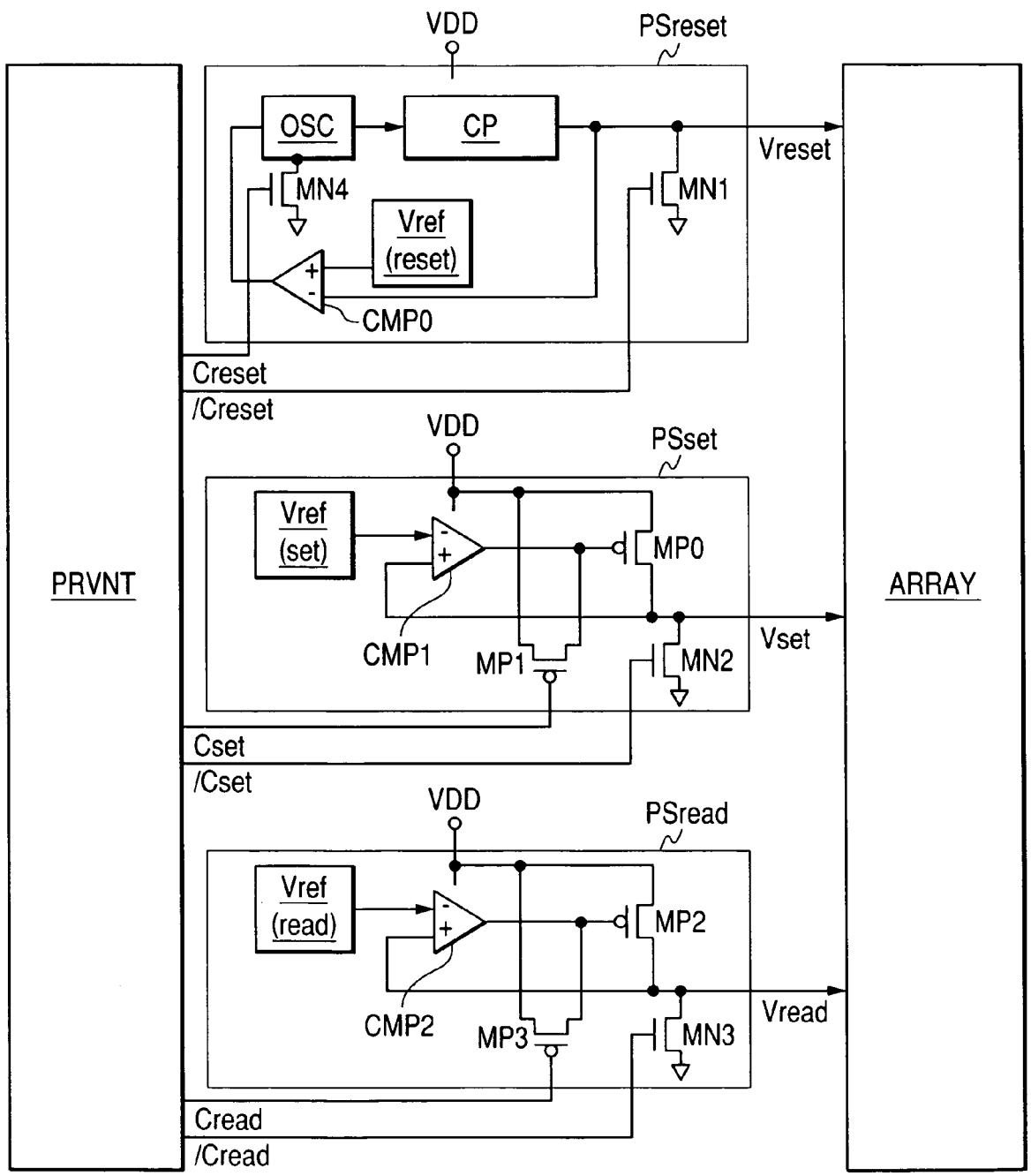
FIG. 9 is circuit diagram of the power supply circuit used in FIG. 1.

Power Supply Circuit Scheme:

The power supply circuit will be described with reference to FIG. 9. In this embodiment, there is a relation in magnitude: Vreset>VDD>Vset>Vread, and the reset power supply circuit PSreset comprises a voltage regulator and each of the set power supply circuit PSset and read power supply circuit PSread comprises a voltage regulator. The control signal Creset is connected from the voltage level detect circuit to the reset power supply circuit PSreset, Cset is connected to the PSset, and Cread is connected to the PSread. Also, the voltage Vreset from the PSreset, the Vset from the PSset, and the Vread from the PSread is supplied to the memory array ARRAY.

The reset power supply circuit PSreset is a voltage regulator comprising a charge pump circuit CP, a ring oscillator OSC, a reference voltage generator circuit Vref (reset), and a compare circuit CP0. The ring oscillator OSC is connected to the N-channel MOS transistor MN4, which turns on and off the ring oscillator by means of the signal Creset connected to its gate electrode. This circuit compares the output voltage Vreset with the generated reference voltage Vref(reset), and if the output voltage is smaller than the reference voltage, then increases the speed of the ring oscillator OSC is increased, and if larger than the reference voltage, then decreases the speed. The output of the ring oscillator OSC is connected to the charge pump CP to generate a boosted voltage Vreset. During power on of the power supply voltage VDD, setting the signal Creset to 'L' will cause the ring oscillator OSC to turn off and the output voltage Vreset to become ground potential.

The set power supply circuit PSset comprises a reference voltage generator circuit Vref(set), a compare circuit CMP1, and a P-channel MOS transistor MP0 that is an output buffer. To the gate electrode of the MP0, a P-channel MOS transistor MP1 is connected, which sets the gate electrode of the P-channel MOS transistor MP0 at power supply voltage VDD or makes it floating, by means of the signal Cset connected to the gate electrode of the MP1. This circuit compares the output voltage Vset with the generated reference voltage Vref(set) and, based on the result, controls the gate electrode of the output buffer P-channel MOS transistor MP0. During power on of the power supply voltage VDD, setting the signal Cset to 'L' will cause the P-channel MOS transistor MP0 to turn off and the output voltage Vset to become ground potential.

The read power supply circuit PSread comprises a reference voltage generator circuit Vref(read), a compare circuit CMP1, and a P-channel MOS transistor MP2 that is an output buffer. To the gate electrode of the MP2, a P-channel MOS transistor MP3 is connected, which sets the gate electrode of the P-channel MOS transistor MP2 at the power supply voltage VDD or makes it floating. This circuit compares the output voltage Vread with the generated reference voltage Vref(read) and, based on the result, controls the gate electrode of the output buffer P-channel MOS transistor MP2. During power on of the power supply voltage VDD, setting the signal Cread to 'L' will cause the P-channel MOS transistor MP2 to turn off and the output voltage Vread to become ground potential.

The above example is the case where Vreset>VDD>Vset>Vread. In other cases, the voltages Vreset, Vset, and Vread are generated from a voltage booster or a voltage regulator, based on the operating voltage VDD of the internal circuit or the operating voltage of the output terminal, as shown in FIG. 10. This embodiment corresponds to the pattern 3 in FIG. 10.

Since a reset requires a large amount of current, it is desirable to use the power supply voltage VDD. Also, the voltage booster has a large size, so it is desirable to use the voltage regulator as much as possible. Hence, the patterns 2, 9, 15, and 16 are ideal.

OTHER EMBODIMENT

Figure 11:
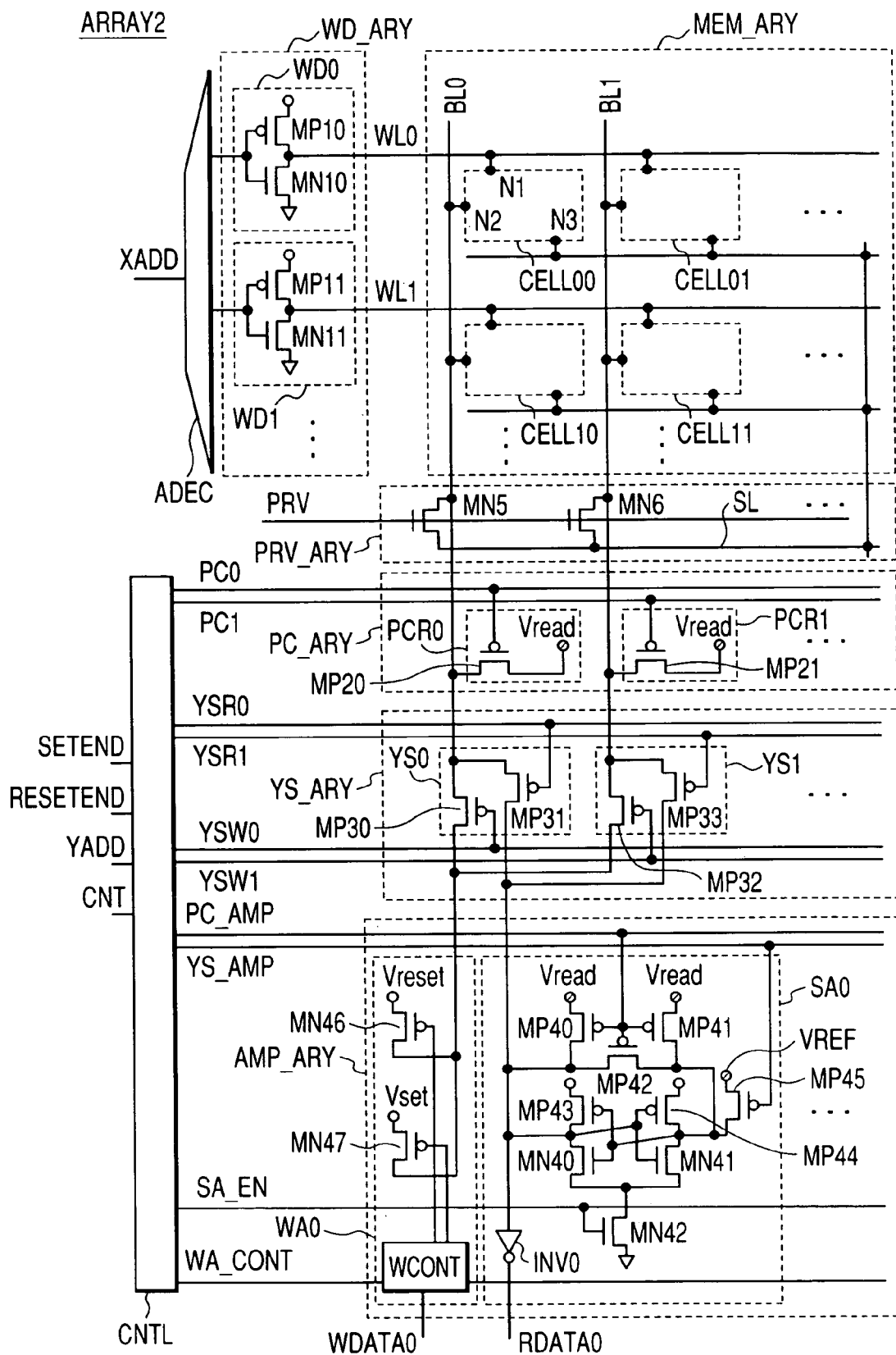
FIG. 11 is a circuit diagram showing another embodiment of the memory array shown in FIG. 3.

FIG. 11 is a partial modification of the memory array shown in FIG. 3. Instead of forcing the word line WL to be at ground potential during power on, the bit line BL and the source line SL are interconnected. In the control array PRV_ARY, N-channel MOS transistors are arranged in a row. The N-channel MOS transistor MN5 is a transistor for connecting the bit line BL0 and source line SL, and is controlled by the control signal PRV.

During power on, the PRV becomes 'H' and the bit line BL and the source line SL are interconnected forcibly to prevent a current flow to the storage element and resulting data destruction. The source line SL may be connected to ground potential, but even if a noise occurs at ground potential no current will flow through the storage element, thus preventing data destruction.

The source line SL may be at the same potential as ground potential, or may be controlled by providing a source line driver in appropriate units. When the source line SL is at ground potential, noise resistance can be improved by arranging them over the memory cell array in planer form. Providing the source line driver in appropriate units allows the fine control of the source line.

Figure 12:
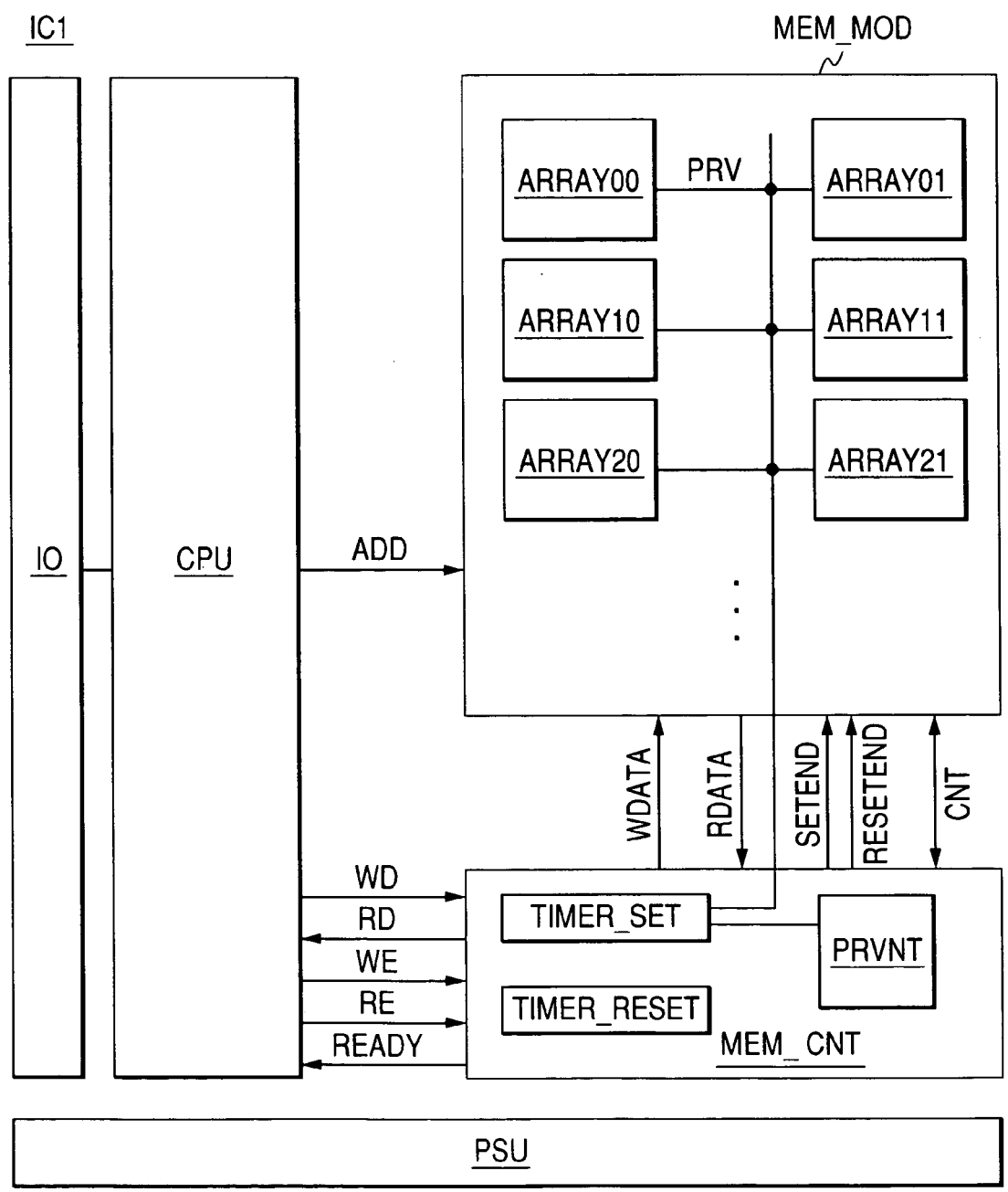
FIG. 12 a block diagram showing an embodiment when used in a system LSI.

FIG. 12 shows an application of the present invention to a system LSI (IC1). The IC1 comprises an input/output circuit 10, a central processor CPU, a memory module MEM_MOD, a memory control circuit MEM_CNT, and a power supply circuit PSU. From the CPU, an address is provided to the memory module MEM_MOD, and write data WD, a write enable signal WE, and a read enable signal RE are supplied to the memory control circuit MEM_CNT. In addition, read data RD and an access ready signal READY are output from the memory control circuit MEM_CTL to the CPU. The memory control circuit MEM_CTL includes a TIMER_SET circuit to measure the SET time, a TIMER_RESET circuit to measure the RESET time, and a voltage level detect circuit PRVNT.

When powered on, the voltage level detect circuit PRVNT detect this, sets the control signal PRV to 'H', connects the word line WL to ground potential, and starts to measure the set TIME at the same time. When the SET time passed, the control signal PRV is set to 'L' and the word line WL is disconnected from ground potential to provide for normal operation. The power supply circuits (PSreset, PSset, and PSread) located in the power supply circuit PSU are activated during the measurement of the SET time. In addition, when the PRV is set to 'L', the access ready signal REAdy is output to the CPU at the same time, to indicate that the memory can be accessed.

Figure 13:
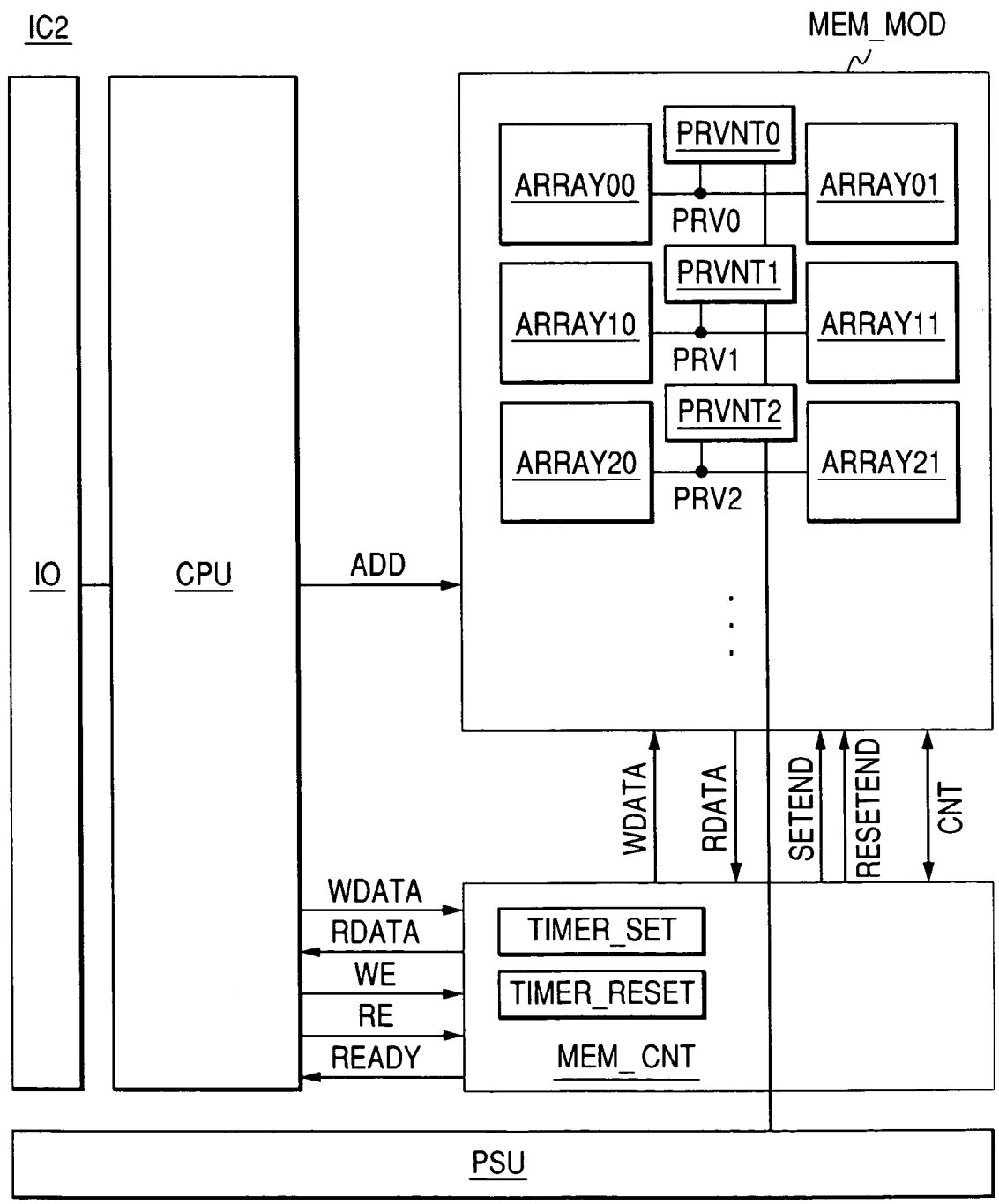
FIG. 13 is a diagram showing another embodiment of the system LSI shown in FIG. 12.

In the phase change memory, if a current flows through the phase change element for a few nanoseconds the data is destroyed. Therefore, when the voltage level detect circuit is located away from the memory array, a signal that forces the word line to turn off is delayed and the possibility of data destruction increases. In view of this, the scheme shown in FIG. 13 has been devised. FIG. 13 is a partial modification of FIG. 12, and a plurality of voltage level detect circuits PRVNT are provided and they are placed one for every two memory arrays ARRAY. For example, the voltage level detect circuit PRVNT0 controls the memory arrays ARRAY00 and ARRAY01. By embedding the voltage level detect circuit PRVNT within the memory module MEM_MOD like this, it is possible to shorten the time period during which a noise at power on may cause a current to flow through the storage element, which prevents data destruction.

Figure 14:
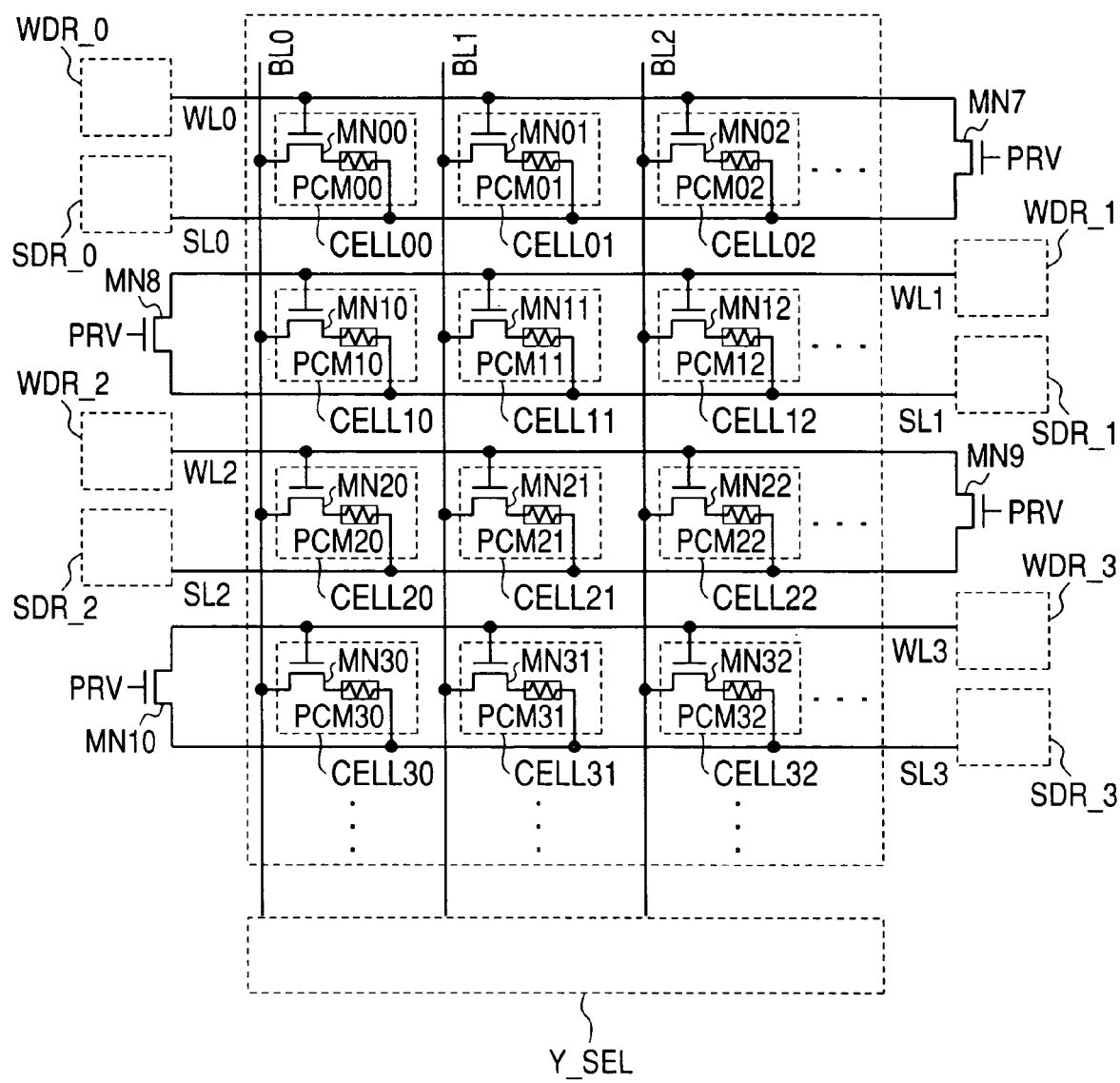
FIG. 14 is a circuit diagram showing still another embodiment of the memory array shown in FIG. 3.

FIG. 14 is a memory array ARRAY3 to which the word line WL and source line SL are connected during power on. For example, to the word line WL0, the word driver WDR_0 and the drain electrode of the N-channel MOS transistor MN7 are connected, and to the source line SL the source line driver SDR_0 and the source electrode of the MN7. During power on, the signal PRV turns 'H' and the word line WL and source line SL are interconnected. As a result, the potential between the gate and source of the N-channel MOS transistor MN, used for the memory cell, becomes 0V, and therefore no current flows through the storage element PCM, which prevents data destruction.

Data Destruction Due to Successive Reads:

The inventors of the present inventions found that if the same phase change element is read successively, it is heated by the current flowing through it and consequently a problem occurs that a reset element (amorphous) is set (crystallized) In order to reduce the heat generation during read, it is effective to lower the voltage to be applied to the element during read and also shorten the voltage application time. However, lowering the voltage leads to decreased read speeds, and shortening the voltage application time involves shortening of the bit line, resulting in the increased area overhead. This embodiment proposes a method of lowering the heat temperature by outputting the data without actually accessing the memory cell, if a read operation is performed successively from the same memory cell.

Figure 15:
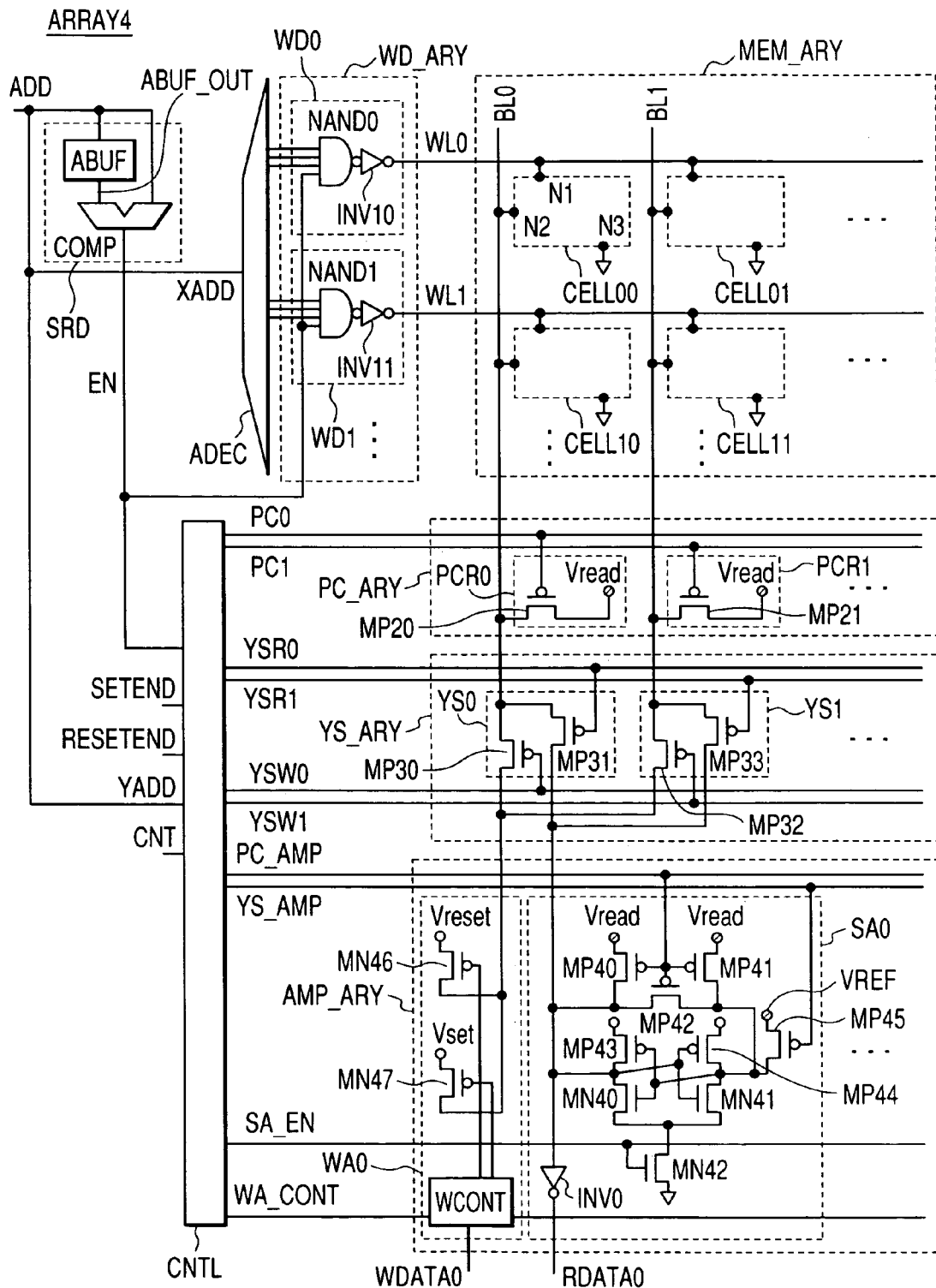
FIG. 15 is a circuit diagram showing yet another embodiment of the memory array shown in FIG. 3.

FIG. 15 is a diagram showing this embodiment, but it is almost the same as FIG. 13, so only the differences are described here. The word driver WD comprises a NAND circuit NAND and an inverter INV, and to which a decode signal from the decoder circuit ADEC and an access enable signal EN are input.

An SDR that detects successive reads is composed of an address buffer ABUF and a compare circuit COMP, and the address buffer ABUF saves an address in every cycle, outputs it to the ABUF_OUT in the next cycle, compares it with an address in the following cycle, and outputs the result as an access enable signal EN.

Figure 16:
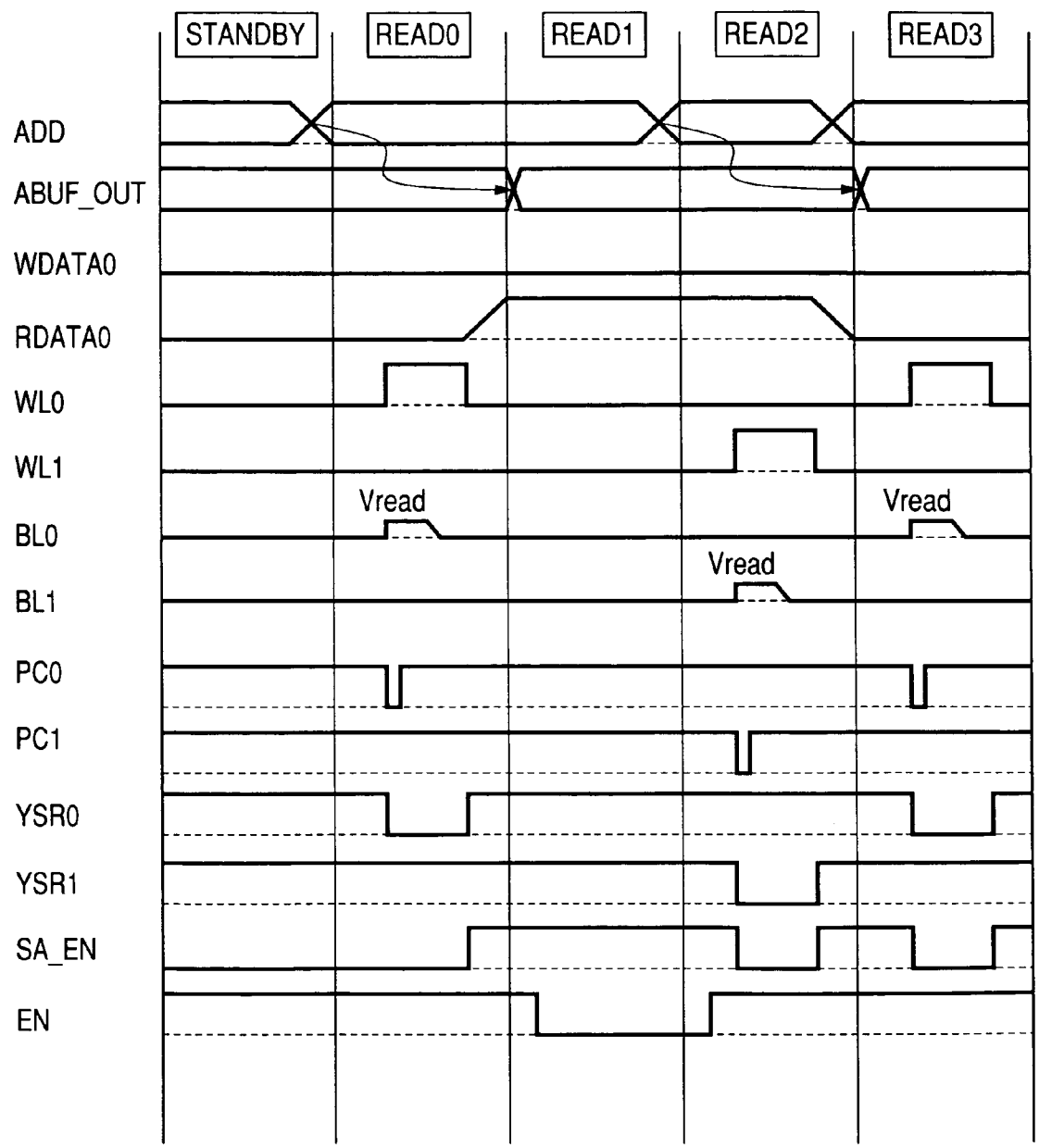
FIG. 16 is an operating waveform diagram of the memory array shown in FIG. 15.

Next, the operation is described with reference to FIG. 16. Since a write is performed in the same way as described in FIG. 7, only a read operation is described here. Data "1" is already written to the memory cell CELL00 and data "0" is written to the memory cell CELL11, and the data in the CELL00 is read first.

The address ADD changes and the word line WL0 and control signal YSR0 are selected. This address is saved in the address buffer ABUF. The precharge control signal PC0 changes from 'H' to 'L', and the bit line BL is precharged to the read voltage Vread. At the same time, the control signal PC_AMP is also changes from 'H' to 'L', and the internal nodes of the sense amplifier circuit SA are precharged. Then, the control signal PC0 changes from 'L' to 'H', a current is flown from the bit line BL0 to ground potential by means of the memory cell CELL00. Since the storage element of the memory cell CELL00 is set and the resistance is, for example, 1 kΩ to 10 kΩ, the bit line voltage drops relatively fast and becomes smaller than the reference voltage VREF. Then, the sense amplifier activation signal SA_EN changes from 'L' to 'H' to amplify the potential difference between the bit line BL0 and reference potential VREF. As a result, "1" is output to the data bus RDATA0.

In this operation, the bit line BL1 that does not performs a read remains at ground potential, and the word line WL1 that does not perform a write also remains at ground potential. As a result, current flows through only the storage element of the memory cell CELL00, and no current flows in the storage element of not only the cell connected to the unselected cell but also the selected cell CELL01, and consequently those storage elements will not be deteriorated.

In the next cycle READ1, a read from the same address is performed. The value of the address ABUF_OUT in the previous cycle is compared with the value of a new address ADD in the comparator COMP. Since both addresses match in this case, the access enable signal EN becomes 'L' and neither the word line WL nor the control signal YSR is selected. Also, the bit line is not precharged. The sense amplifier activation signal SA_EN becomes 'H' to leave the previous data outputted. Because of this, the data can be output with no current flowing current in all the memory cells, and thus destruction of the storage element can be prevented.

In the next cycle READ2, data "0" is read from the memory cell CELL11. The address ADD changes and this address is saved in the address buffer ABUF. The previous address value of ABUF_OUT is compared with a new address value of the ADD. Since both addresses do not match in this case, the access enable signal EN becomes 'H' and the word line WL1 and control signal YSR1 are selected. The precharge control signal PC0 changes from 'H' to 'L' and the bit line BL1 is precharged to the read voltage Vread. At the same time, the sense amplifier activation signal SA_EN becomes 'L' and the control signal PC_AMP changes from 'H' to 'L', and the internal nodes of the sense amplifier circuit SA are precharged. Then, the control signal PC1 changes from 'L' to 'H' to flow current from the bit line BL0 to ground potential by means of the memory cell CELL11. Since the storage element of the memory cell CELL11 is reset and the resistance is, for example, 100 kΩ to 1 MΩ, the bit line voltage changes little and remains larger than the reference voltage VREF. Thereafter, the sense amplifier activation signal SA_EN changes from 'L' to 'H' and the potential difference between bit line BL1 and reference potential VREF is amplified. As a result, "0" is output to the data bus RDATA0.

By performing the operation as described above, current flows in only the memory cell that performed a read, thus making it possible to minimizing the destruction of the value of the storage element. Furthermore, since it is not necessary in effect to flow current in the element when the same element is accessed successively, destruction of the storage element value can be prevented.

In this embodiment, although the data is held in the sense amplifier circuit and output from it, but it is also possible to hold the data in a latch circuit or the like. In addition, it is desirable to generate an internal signal, such as one for activating the word line WL, from the rising edge of a clock, so that the signal will be constant even if the frequency is changed. This enables the suppression of heat generation and thus increases the reliability, when the frequency is lowered.

Also, by providing a plurality of address buffers ABUF and using them in turn, the number of actual accesses to the memory cell can be further reduced.

Error Checking and Correction:

If data destruction (a reset element in amorphous state is set, or crystallized, due to the heat generation or temperature increases resulting from a read) occurs in one bit at the same address, another cell is likely to be destroyed. Accordingly, if a single bit error is detected by the error checking and correction ECC during a read, rewriting all the data becomes effective. This will be described in detail below.

Figure 17:
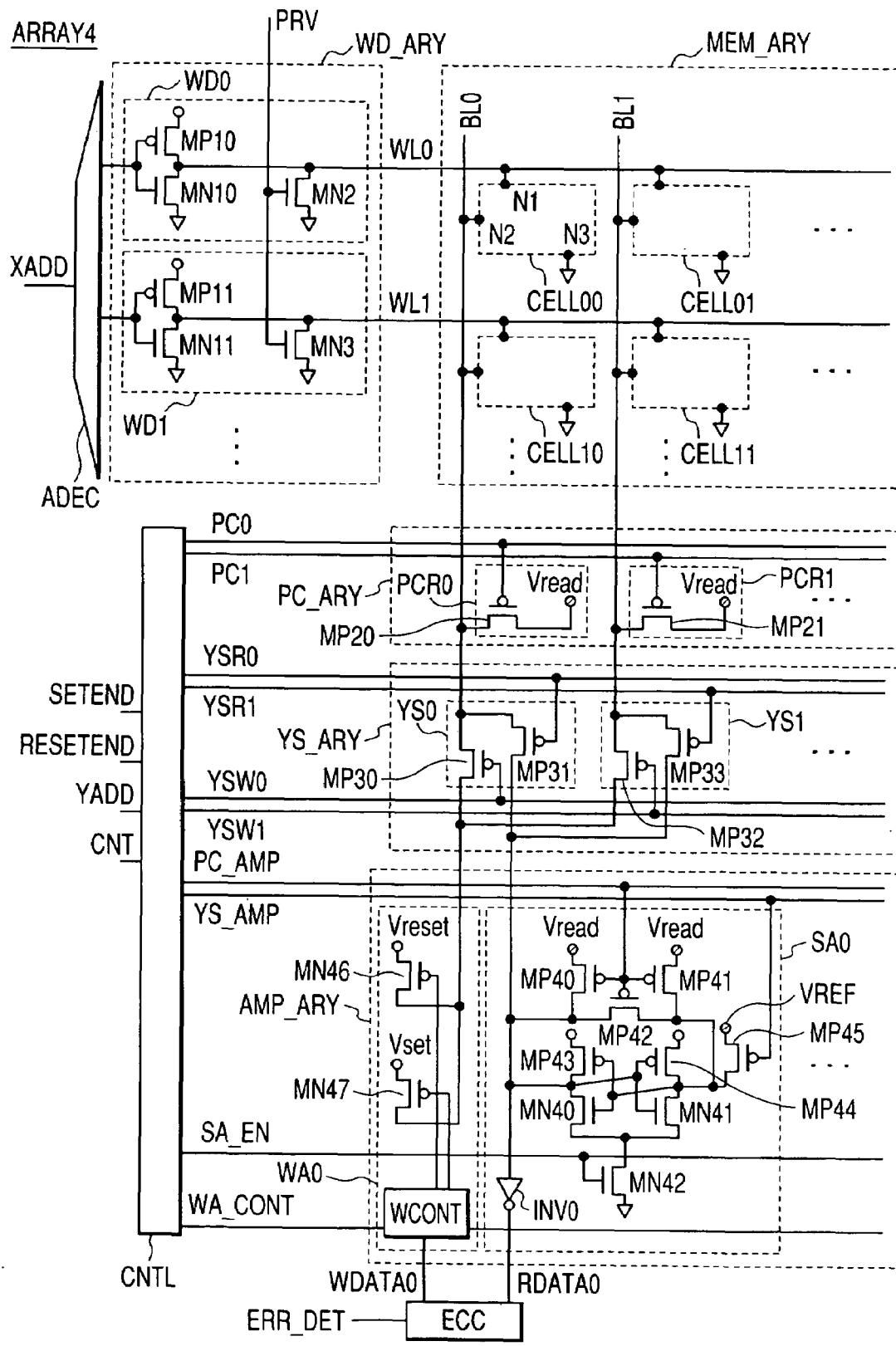
FIG. 17 is a circuit diagram of another embodiment of the memory array shown in FIG. 3.

FIG. 17 is a diagram showing this embodiment, but it is almost the same as FIG. 3, so the only the differences are described. The read data RDATA is connected to the error checking and correction ECC, which in turn is connected to the write data WDATA. The error checking and correction ECC outputs an error detection signal ERR_DET. The memory cell array MEM_ARY contains parity bits as well as ordinary memory cells.

Figure 18:
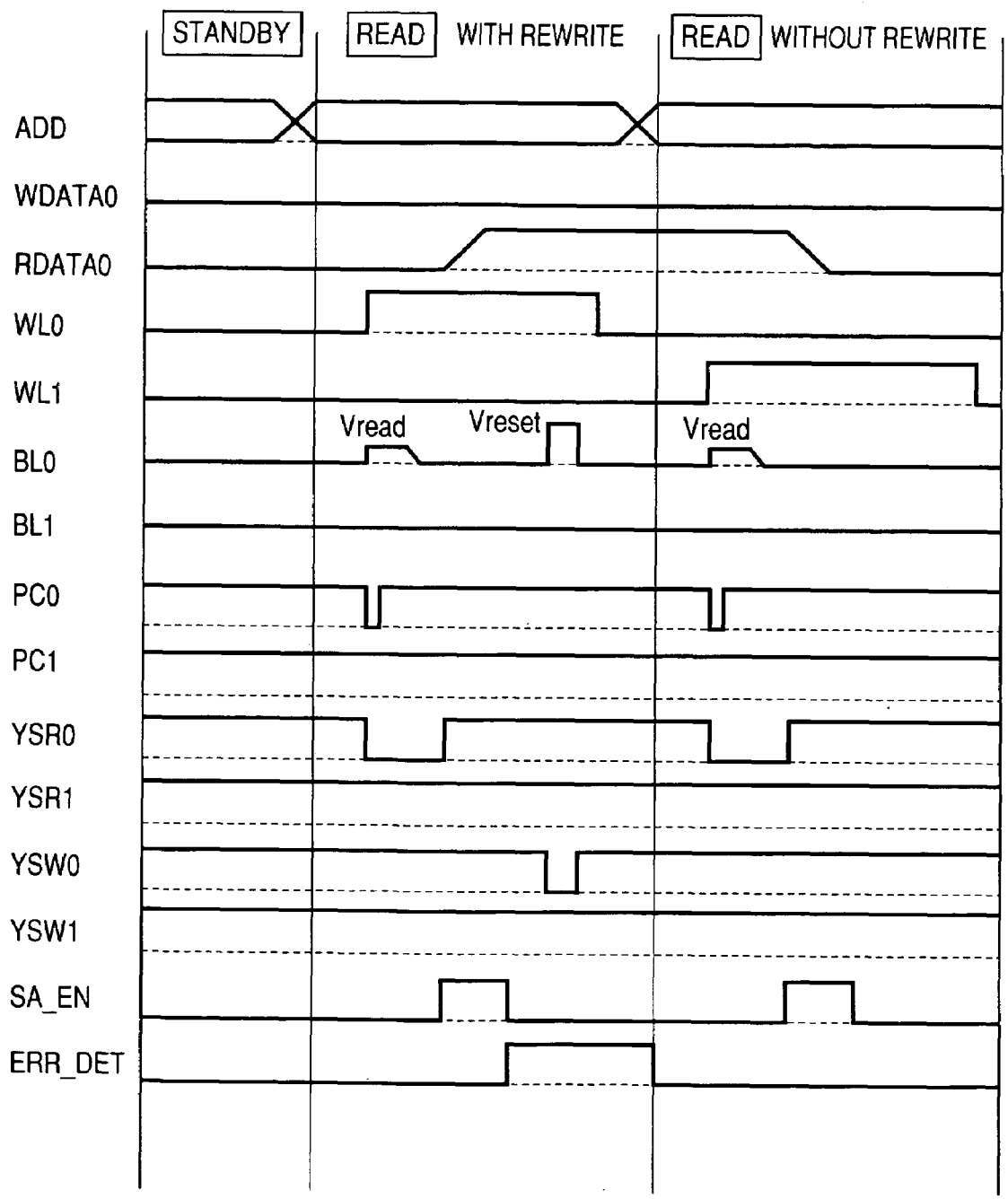
FIG. 18 is an operating waveform diagram of the memory array shown in FIG. 17.

Next, the operation will be described with reference to FIG. 18. Since a normal write is performed in the same way as described with reference to FIG. 6, only the case of a read is described here. Data "0" has been written to the memory cell CELL00 and the data in the CELL00 is read.

The address ADD changes and the word line WL0 and control signal YSR0 are selected. The precharge control signal changes from 'H' to 'L' and the bit line BL is precharged to the read voltage Vread. At the same time, the control signal PC_AMP also changes from 'H' to 'L' and the internal nodes of the sense amplifier circuit SA are precharged. Then, the control signal PC0 changes from 'L' to 'H' to flow current from the bit line BL0 to ground potential by means of the memory cell CELL00. The storage cell of the memory cell CELL00 is reset and the resistance was, for example, 100 kΩ to 1 MΩ, but the resistance has dropped to less than 100 kΩ due to deterioration, and hence the bit line voltage decreases relatively fast and becomes smaller than the reference voltage VREF. Thereafter, the sense amplifier activation signal SA_EN changes from 'L' to 'H' to amplify the potential difference between the bit line BL0 and reference potential VREF. As a result, "1" is output to the data bus RDATA0.

The read data is corrected by the error checking and correction ECC. If an error occurs, then the error detection signal ERR_DET becomes 'H' and the data is written again only to the memory cell to which data "0" was written at the same address.

The control signal YSW0 is selected and the voltage Vreset is supplied to the bit line in order to write data "0". After a voltage is applied for a time sufficient to reset the storage element, the word line WL is turned off to terminate the write operation.

The inventors found that, in the phase change memory, noises occurring during power on or power off, or heat stress caused by the current flowing in the storage element, if the same memory cell is read successively, may result in data destruction in the direction of crystallizing the reset element (in amorphous state), but will not amorphousize the set element (in crystalline state). That is, normally, only the reset element is destroyed into set state, and therefore when performing a write after the error detection, it is enough to perform a reset (write data "0"). Since the RESET time is relatively short as compared with the SET time or read time, if a reset is done after a read operation, usually a reset operation little affects the read cycle and can be hidden within the same read cycle.

Also, reading the data once during power on and then writing the destroyed data again is effective for reliability improvement. At this time, performing a read with an intentionally narrowed margin enables a data destruction to be detected when the degree of deterioration is small, and is therefore effective. Delaying the timing of the sense amplifier activation signal SA_EN allows a read to be performed with a narrower margin. This makes it possible to detect a decrease in the resistance of an RESET state element. It is also possible to perform a read with a narrower margin, by raising the reference voltage for the sense amplifier.

Various modifications are possible within the spirit of the present invention. For example, the present invention is particularly effective for storage devices using storage elements that rewrite the stored information by means of electric current, instead of phase change elements.

What is claimed is:

1. A semiconductor device comprising:
   a power supply terminal;
   a plurality of word lines extending in a first direction;
   a plurality of bit lines extending in a second direction and intersecting with said plurality of word lines;
   a memory array including a plurality of memory cells disposed at the intersections of said plurality of word lines and said plurality of bit lines;
   a plurality of word drivers connected to each of said plurality of word lines;
   a plurality of read circuits and write circuits connected to said plurality of bit lines; and
   a power supply circuit that converts a power fed to said power supply terminal and supplies said power to internal circuits; and
   a detect circuit which detects variations in power supply potential,
   wherein each of said plurality of memory cells has a selection element and a storage element alternately connected in series to corresponding one line of said plurality of bit lines,
   wherein the control electrode of said selection element is connected to corresponding one line of said plurality of word lines,
   wherein said storage element stores data according to the changes in resistance and allows rewriting the information by flowing electric current, and
   wherein said selection element is unselected by said word lines, when said detect circuit detects variations in power supply potential.

2. A semiconductor device according to claim 1,
   wherein said detect circuit detects a voltage supplied to said power supply terminal as a variation in the power supply potential, and unselects said selection element by means of said word line in order to block the current path to said storage element.

3. A semiconductor device according to claim 1,
   wherein said detect circuit detects that the potential of said power supply terminal dropped below a predetermined potential, and unselects said selection element by means of said word line in order to block the current path to said storage element.

4. A semiconductor device according to claim 1,
   wherein said plurality of power supply circuits includes a voltage generator circuit to write data to said memory cells.

5. A semiconductor device according to claim 1,
   wherein said plurality of power supply circuits comprises a first power supply circuit generating a first voltage to write first level data to said storage element, a second power supply circuit generating a second voltage to write second level data to said storage element, and a third power supply circuit generating a third voltage to read the data stored in said storage cell, and
   wherein said second voltage is smaller than said first voltage and larger than said third voltage.

6. A semiconductor device according to claim 1,
   wherein said power supply voltage to be applied to said power supply terminal is used to write the first level data to said storage element,
   wherein said plurality of power supply circuits comprise a second power supply circuit generating a second voltage to write second level data to said storage element, and a third power supply circuit generating a third voltage to read the data stored in said storage element, and
   wherein said second voltage is smaller than said first power supply voltage and larger than said third voltage.

7. A semiconductor device according to claim 1,
   wherein said selection element is an N-channel MOS transistor.

8. A semiconductor device according to claim 1,
   wherein said storage element is a phase change element.

* * * * *